United States Patent [19]

Lechner

[11] Patent Number: 4,607,177

[45] Date of Patent: Aug. 19, 1986

[54] CIRCUIT ARRANGEMENT FOR CONVERSION TTL LOGIC SIGNALS TO ECL LOGIC SIGNALS

[75] Inventor: Alexander Lechner, Faak, Austria

[73] Assignee: Siemens Aktiengesellschaft, Berlin and Munich, Fed. Rep. of Germany

[21] Appl. No.: 491,985

[22] Filed: May 5, 1983

[30] Foreign Application Priority Data

May 7, 1982 [DE] Fed. Rep. of Germany ....... 3217237

[51] Int. Cl.$^4$ ................ H03K 19/092; H03K 19/086; H03K 19/003
[52] U.S. Cl. .................................... 307/475; 307/455; 307/264
[58] Field of Search ............................ 307/454–458, 307/466, 467, 475, 482, 544, 546, 547, 549, 551, 553, 558, 559, 560, 567, 264, 443

[56] References Cited

U.S. PATENT DOCUMENTS

| | | | |
|---|---|---|---|
| 3,558,914 | 1/1971 | Schmidt | 307/455 |
| 3,688,127 | 8/1972 | Potter et al. | 307/443 X |
| 3,787,737 | 1/1974 | Mukai | 307/454 |
| 3,860,830 | 1/1975 | Sugiura et al. | 307/457 X |
| 4,356,409 | 10/1982 | Masuda et al. | 307/455 X |
| 4,357,548 | 11/1982 | Preslar | 307/455 X |
| 4,533,842 | 8/1985 | Yang et al. | 307/455 X |

OTHER PUBLICATIONS

The Integrated Circuits Catalog for Design Engineers, First Edition, Texas Instruments, 1971, pp. 4–73 to 4–48.
Motorola MECL Integrated Circuits, prepared by Technical Information Center, 1978, pp. 3–19.

Primary Examiner—Stanley D. Miller
Assistant Examiner—David R. Bertelson
Attorney, Agent, or Firm—Herbert L. Lerner; Laurence A. Greenberg

[57] ABSTRACT

A circuit arrangement for level conversion of TTL-logic levels to ECL-logic levels with at least one emitter-coupled current switch having an input addressable by TTL-logic levels and an output from which ECL-logic levels can be taken off, including a first current switch formed of two emitter-coupled npn-transistors (and a second current switch formed of two emitter-coupled pnp-transistors, one of the transistors of the second current switch being arranged as input stage for the first current switch, the second current switch having a switching threshold higher than that of the first current switch.

7 Claims, 4 Drawing Figures

CIRCUIT ARRANGEMENT FOR CONVERSION TTL LOGIC SIGNALS TO ECL LOGIC SIGNALS

The invention relates to a circuit arrangement for level conversion of TTL-logic levels to ECL-logic levels having at least one emitter-coupled current switch which is addressed on the input side by TTL-logic levels, the current switch having an output at which ECL-logic levels can be taken off.

By means of level converters, the logic levels of one family of logic members are converted to the logic levels of another family. By TTL levels there is understood to mean the levels of TTL (transistor-transistor logic) technology but in general also other standard logic levels such as the levels of RTL (resistance-transistor logic), DTL (diode-transistor logic) technology or HLL (high-level logic) levels. TTL levels, as a rule, are standardized so that the voltage, referred to the potential "0", for representing a logical "high" state must be $\geq 2$ volts and for representing a logical "low" state, $\leq 0.8$ volts. The levels occurring in ECL (emitter-coupled logic) technology are generally also referred to the potential "0", but have a distinctly smaller interference margin between "high" state and "low" 0 state. For ECL levels, the voltage for representing a logical "high" state, for example, must be $\geq -0.98$ volts and for representing a logical "low" state, $\leq -1.63$ volts.

Circuit arrangements of the type mentioned at the introduction hereto are known, for example, from the integrated Circuits Catalog for Design Engineers, First Edition, Texas Instruments, 1971, pages 4-73 to 4-84 or from Motorola MECL Integrated Circuits, 1978, pages 3-19.

In order that TTL as well as ECL levels may be referred to the voltage "0", the heretofore known circuit arrangements require two supply voltages of different polarity and therefore a more elaborate power supply than level converters according to the invention which require only one supply voltage.

It is accordingly an object of the invention to provide a circuit arrangement for level conversion which has brief delay times and requires only one supply voltage, which consequently affords considerable improvement over heretofore known circuit arrangements of this general type.

With the foregoing and other objects in view, there is provided, in accordance with the invention a circuit arrangement for level conversion of TTL-logic levels to ECL-logic levels, including at least one emitter-coupled current switch having an input addressable by TTL-logic levels and an output from which ECL-logic levels can be taken off, comprising a first current switch formed of two emitter-coupled npn-transistors and a second current switch formed of two emitter-coupled pnp-transistors, one of the transistors of the second current switch being arranged as input stage for the first current switch, the second current switch having a switching threshold higher than that of the first current switch.

In accordance with another feature of the invention, the extent to which the switching threshold for the second current switch is higher than that of the first current switch is by about a base-emitter threshold voltage.

In accordance with an additional feature of the invention there is provided means for taking ECL-logic levels off at least at one output of the first current switch.

In accordance with a further feature of the invention both the first and the second current switches have a reference voltage defined by the relationship:

$$U_{TTL0} + U_{BE} < U_{Ref} < U_{TTL1} + U_{BE}$$

wherein
$U_{TTL0}$=TTL-input level "low",
$U_{TTL1}$=TTL-input level "high",
$U_{BE}$=Base-emitter threshold and
$U_{Ref}$=Reference Voltage.

In accordance with still another feature of the invention both the first and the second current switches have a reference voltage defined by the equation:

$$U_{ref} = \frac{U_{TTL0} + U_{TTL1}}{2} + U_{BE},$$

wherein
$U_{Ref}$=Reference Voltage,
$U_{TTL0}$=TTL-input level "low",
$U_{TTL1}$=TTL-input level "high" and
$U_{BE}$=Base-emitter threshold.

In accordance with again an additional feature of the invention, a coupling capacitor is connected between the base and the emitter of the one transistor of the second current switch.

In accordance with a concomitant feature of the invention the two emitter-coupled transistors of the first current switch have emitters connected to a current source and have collectors connected via respective collector resistors to a supply voltage, means for taking off ECL-logic levels from the collectors, inverted levels being taken off the collector of the one transistor, and non-inverted levels being taken off the collector of the other transistor, and wherein the two emitter-coupled transistors of the second current switch have emitters which are connected to the base of the transistor of the first current switch and are also connected to a current source, the two transistors of the second current switch having collectors connected to ground, one of the transistors of the second current switch having a base addressable by the TTL-logic levels, the other of the transistors of the second current switch having a base connected to the base of the other transistor of the first current switch and also connected to a reference voltage.

An added advantage of the circuit arrangement according to the invention of the instant application is that saturation of the transistors of the first or one current switch is avoided and a short delay time is thereby obtained.

Other features which are considered as characteristic for the invention are set forth in the appended claims.

Although the invention is illustrated and described herein as embodied in a circuit arrangement for level conversion, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

In the figures, like elements are identified by the same reference characters.

Figure 1:
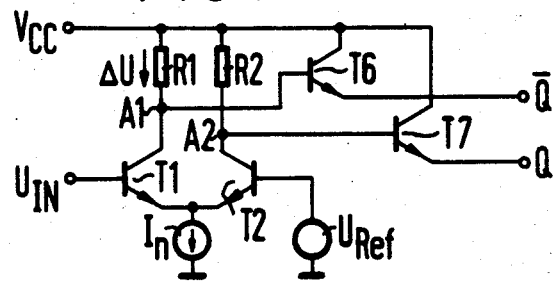
FIG. 1 is a circuit diagram of one embodiment of an arrangement for level conversion requiring only one supply voltage which has one current switch.

Referring now to the drawing and first, particularly, to FIG. 1 thereof, there is shown an embodiment of the circuit arrangement for level conversion according to the invention wherein a TTL level as an input signal $U_{IN}$ addresses a current switch formed of two npn transistors T1 and T2. The first transistor T1 and the second transistor T2 of the current switch are connected via their coupled emitters to a current source $I_n$ connected to ground, which can be constructed as a conventional constant-current source and, in the simplest case, as a resistor. The collectors of the first and second transistors T1 and T2 are connected via respective collector resistors R1 and R2 to a supply voltage $V_{cc}$.

The base of the first transistor T1 is addressed by the input signal $U_{IN}$, while the base of the second transistor T2 is connected to a reference voltage source $U_{ref}$ which is tied to ground. The voltage of the reference voltage $U_{ref}$ may be provided in the simplest case, by a voltage divider and has a selected value between the voltage of the "high" state and the voltage of the "low" state of the input signal. Advantageously, the value of the selected voltage is in the middle between the two signals i.e. approximately 1.4 V.

At the inverting output A1 of the current converter, the inverted ECL level $\overline{Q}$ can be taken off either directly or via a transistor T6 connected as an emitter follower. The non-inverted ECL level can be taken indirectly off the non-inverting output A2 of the current converter via the transistor T7 connected thereto as an emitter follower, or directly off the output A2.

The differential amplifier, which is formed of the two transistors T1 and T2 as a current switch, operates in the manner known from ECL technology i.e. the transistor having a base potential which is higher than that of the other transistor is switched into conduction. The resistors R1 and R2 are of such size that the output signals Q and $\overline{Q}$, respectively, have the desired ECL excursion $\Delta U$, referred to the supply voltage $V_{cc}$. The construction can be effected, for example, in such a manner that the ECL level "high" is $\geq V_{cc} - 0.8$ volts and the ECL level "low" is $\leq V_{cc} - 1.3$ volts. In comparison with conventional ECL current switch elements, this current switch, however, operates with a reference voltage $U_{ref}$ referred to ground. If a "high" level is present at the input $U_{IN}$, then the voltage $\Delta U$ drops at the resistor R1 but not at the resistor R2, so that a "low" level with the voltage $V_{cc} - \Delta U - U_{BE}$ (wherein $U_{BE}$ = base-emitter threshold voltage of the emitter-follower transistor T6) is present at the output $\overline{Q}$ and a "high" level at the output Q.

In converse, if the input signal $U_{IN}$ is "low", then the transistor T2 conducts so that the output signal $\overline{Q}$ has "high" level and the output signal Q "low" level.

The illustrated embodiment thus shows a level converter which requires only one supply voltage, and in which the output levels also vary because they are referenced to the supply voltage.

Such level converters are of advantage particularly if an integrated circuit is addressed from the outside with TTL levels and a supply voltage corresponding to TTL technology (for example, +5 volts), however, ECL technology is to be used internally for reasons of speed.

In order to keep the delay time of the level converter as low as possible it is advisable to use npn transistors internally to the chip as well as for the transistors T1 and T2. The circuit arrangement according to FIG. 1 has disadvantages, however, if the input signal $U_{IN}$ is greater than the supply voltage $V_{cc}$ because then the transistor T1 operates in saturation and the level converter therefore has an excessively long delay time. Furthermore, a high reverse voltage can appear at the base-emitter path of the transistor T2. Because the base-emitter paths, however, have low break-through voltages in fast transistors, the transistor T2 is then in danger of being destroyed.

Figure 2:
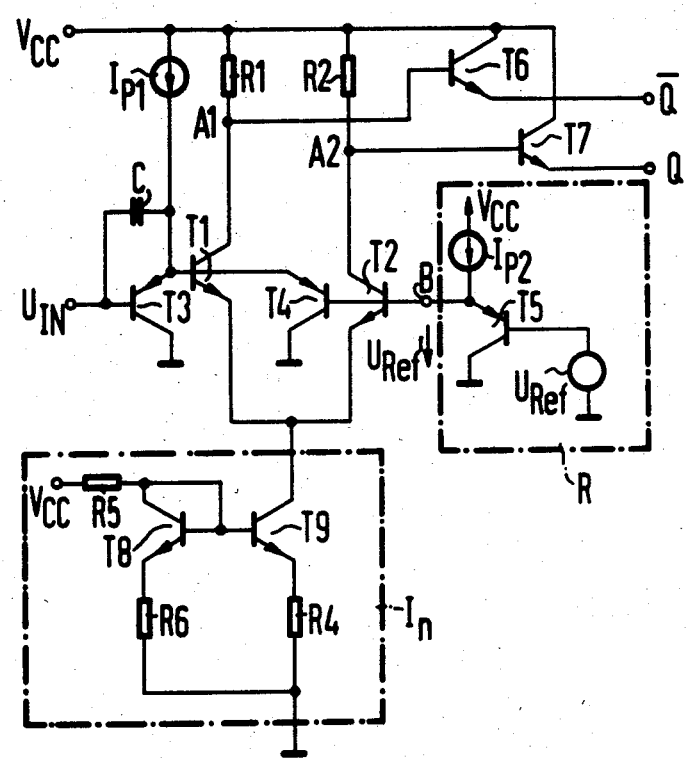
FIG. 2 is a circuit diagram of another embodiment of the arrangement according to the invention, with a first and a second current switch.

In order to prevent these disadvantages, in accordance with the invention, the first (active) current switch formed of two npn-transistors T1 and T2 is supplemented by a second current switch which is likewise emitter-coupled but is formed of pnp-transistors T3 and T4. The pnp-transistors T3 and T4 may advantageously be realized as substrate pnp, the collector of which must always be at ground potential. An embodiment of a suitable arrangement thereof is shown in FIG. 2. The comments to FIG. 1 apply correspondingly to the arrangement and operation of the transistors T1 and T2, the collector resistors R1 and R2 of the emitter-followers T6 and T7, respectively, and the current source $I_n$. The second current switch is formed of two pnp-transistors T3 and T4, the first transistor T3 of the second current switch being connected as the input stage for the first transistor T1 of the first current switch. The switching threshold for the second current switch is higher than that of the first current switch. In the embodiment illustrated in FIG. 2, this is realized by providing that the input voltage $U_{IN}$ address the base of the first transistor T3 of the second current switch, the collector of which be tied to ground and the emitter of which be connected on the one hand via the current source $I_{p1}$ to the supply voltage $V_{cc}$ and on the other hand, to the base of the first transistor T1 of the first current switch. The second transistors T4 of the second current switch is arranged so that its emitter is connected to the base of the first transistor T1 of the first current switch, its base to the base of the second transistor T2 of the first current switch, and its collector to ground. Thus, the switching threshold for the second current switch is higher by a base-emitter threshold voltage than that of the first current switch.

Figure 3:
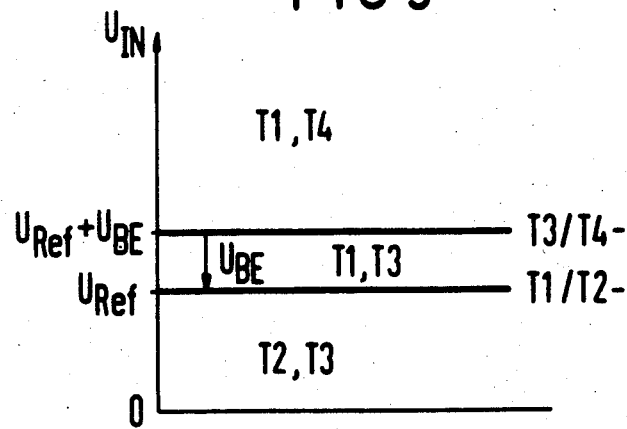
FIG. 3 is a plot diagram providing a graphic representation of the conduction behavior of the transistors of FIG. 2 as a function of the input voltage.

The conduction states of the transistors T1, T2, T3 and T4 as a function of the input voltage $U_{IN}$ are shown in FIG. 3. The graphic presentation of FIG. 3 is based on a voltage $U_{Ref}'$ applied to a point B which is formed from the sum of a reference voltage $U_{Ref}$ and a base-emitter threshold voltage $U_{BE}$. Such a voltage $U_{Ref}'$ can be obtained, for example, in accordance with the circuit arrangement shown in FIG. 2 in the box R formed by dot-dash lines. The circuit arrangement R provides a reference voltage $U_{ref}$ (for example 1.4 V) which is coupled to ground and is connected to the base of a pnp transistor T5, the collector of which is tied to ground and the emitter of which is connected on the one side to the point B and on the other side, via a current source $I_{p2}$, to the supply voltage $V_{cc}$ i.e. the transistor T5 is connected as an emitter-follower. In order to obtain identical base-emitter thresholds of the transistors T3 and T5, the current sources $I_{p1}$ and $I_{p2}$ which are provided are advantageously of such value that the currents flowing through the transistors T3 and T5 are equal.

If the input voltage $U_{IN}$ is smaller than the switching voltage threshold of the current converter (T1/T2 switching threshold) formed by the transistors T1 and T2 i.e. is smaller than the reference voltage $U_{Ref}$, the transistor T2 and the transistor T3, which has a lower base potential, thus conduct so that a "low" signal is present at the output Q. If the input voltage $U_{IN}$ is between the T1/T2 switching threshold and the T3/T4 switching threshold (the switching threshold of the current switch formed by the transistors T3 and T4 i.e. of the voltage $U_{Ref}+U_{BE}$), then the transistors T3 and T1 conduct so that the output signal Q has "high" level. If the input signal $U_{IN}$ is larger than the T3/T4 switching threshold, then the transistors T1 and T4 conduct. The high input voltage thus drops at the base-emitter path of the pnp-transistor T3, and the voltage at the base-emitter path of the npn-transistor T2 is limited to approximately 0 volts. Because pnp-transistors can generally stand higher base-emitter voltages than npn-transistors, the circuit arrangement according to FIG. 2 is therefore more reliable than that of FIG. 1.

Saturation of the transistor T1 in the case of high input voltages is avoided in the circuit arrangement according to the invention because the base potential of the transistor T1 cannot exceed the sum of the voltage $U_{Ref}'+U_{BE}$. Furthermore, negative input voltages $U_{IN}$ are limited by means of the base-collector diode of the transistor T3.

The current sources $I_n$, $I_{p1}$ and $I_{p2}$ may be realized as conventional constant-current sources and, in the simplest case, as resistors. The reference voltage $U_{Ref}$ is advantageously selected so that it is midway between the TTL level "high" and the TTL level "low" i.e. at about 1.4 V. The current gain of the transistors T1 to T4 is generally so large that the base currents thereof can be neglected.

Because pnp transistors are relatively slow for fast integrated circuits when conventional processes are used, a coupling capacitor C is advantageously connected between the base and the emitter of the first transistor T3 of the second current switch, so that, for short times, the capacitor C shifts the input level and not the transistor T3. The capacitor C may be realized as a barrier layer capacitor of the base-emitter diode of the transistor T3.

In an embodiment according to FIG. 2, the currents generated by the current sources $I_{p1}$ and $I_{p2}$ were 0.25 mA, respectively, the current source $I_n$ was 0.6 mA, the reference voltage $U_{Ref}$ was 1.4 V, the base-emitter threshold voltages of the transistors T1 to T7 were 0.8 V, the capacitor C was 1.2 pF and the resistors R1 and R2 were 830 ohms, respectively. The current source $I_{p1}$ was realized by a 12-kohm resistor. The reference voltage $U_{Ref}$ was realized as a temperature and supply voltage-compensated network (so-called "band-gap reference"). The npn-transistors have an emitter area (area of the emitter-implantation region in a plan view) of 40 $\mu m^2$, the emitter-base capacitances and collector-base capacities thereof were 0.1 pF, respectively, and the collector-substrate capacity thereof was 0.45 pF. The npn transistors T3, T4 and T5 were provided in conventional manner as substrate transistors, the collector of which is always tied to the ground.

The transistor T5 serves as the counterpart to the transistor T3, whereby the switching threshold of the first current switch (T1, T2) is temperature-compensated. The transistors T3 and T5 must therefore be operated with approximately the same emitter current.

As shown in FIG. 2 in the suitably identified box formed of dot-dash lines, the current source $I_n$ is realized as a current mirror with a transistor diode; the resistances R4 and R6 are 330 ohms and the resistor R5 is 6.75 kohm.

Figure 4:
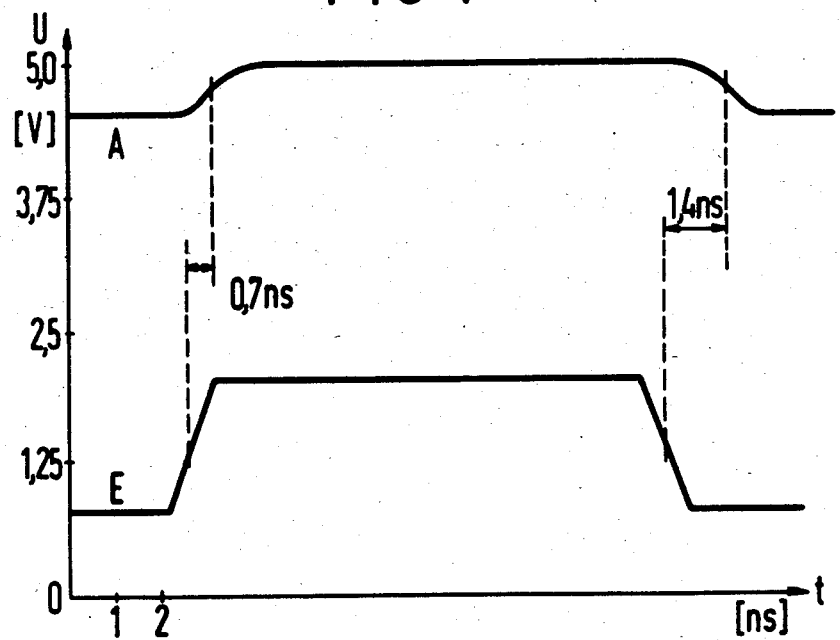
FIG. 4 is a pulse diagram of the delay time of an embodiment of the circuit arrangement according to the invention.

The waveform of the input pulse E present at the input $U_{IN}$ and the waveform of the output pulse A delivered at the output Q can be seen in FIG. 4. The delay time from the average level of the rising edge of the input pulse E to the output pulse A was only 0.7 ns, the delay time from the level average of the falling edge of the input pulse E to the output pulse A was only 1.4 ns. It is therefore possible to create a fast TTL-ECL level converter which can be used to advantage for an integrated circuit which is internally constructed in ECL-circuit technology, has external TTL-compatible terminals and is operated exclusively with one supply voltage (for example +5 volts).

The foregoing is a description corresponding in substance to German Application P 32 17 237.0, dated May 7, 1982, the International priority of which is being claimed for the instant application, and which is hereby made part of this application. Any material discrepancies between the foregoing specification and the aforementioned corresponding German application are to be resolved in favor of the latter.

I claim:

1. Circuit arrangement for level conversion of TTL-logic levels to ECL-logic levels including at least one emitter-coupled current switch having an input addressable by TTL-logic levels and an output from which ECL-logic levels can be taken off, comprising a first current switch formed of first and second emitter coupled npn-transistors having their emitters commonly connected to ground reference potential via a current source and their collectors connected to supply potential via respective collector resistors, and a second current switch formed of first and second emitter-coupled pnp-transistors having their emitters connected to supply potential via a current source and having their collectors connected to ground reference potential, the first transistor of said second current switch being controlled by the input signal to the circuit arrangement and serves as input stage for the first transistor of said first current switch, said second transistors of the first and second current switch being connected at their control inputs to a reference potential and said second current switch having a switching threshold higher than that of said first current switch.

2. Circuit arrangement according to claim 1, wherein the extent to which said switching threshold for said second current switch is higher than that of said first current switch is by about a base-emitter threshold voltage.

3. Circuit arrangement according to claim 1 including means for taking ECL-logic levels off at least at one output of said first current switch.

4. Circuit arrangement according to claim 1 wherein both said first and said second current switches have a reference voltage defined by the relationship:

$$U_{TTL0} + U_{BE} < U_{Ref} < U_{TTL1} + U_{BE},$$

wherein
- $U_{TTL0}$ = TTL-input level "low",
- $U_{TTL1}$ = TTL-input level "high",
- $U_{BE}$ = Base-emitter threshold and
- $U_{Ref}$ = Reference Voltage.

5. Circuit arrangement according to claim 1, wherein both said first and said second current switches have a refrence voltage defined by the equation:

$$U_{ref} = \frac{U_{TTL0} + U_{TTL1}}{2} + U_{BE},$$

wherein
- $U_{Ref}$ = Reference voltage,
- $U_{TTL0}$ = TTL-input level "low",
- $U_{TTL1}$ = TTL-input level "high" and
- $U_{BE}$ = Base-emitter threshold.

6. Circuit arrangement for level conversion of TTL-logic levels to ECL-logic levels including at least one emitter-coupled current switch having an input addressable by TTL-logic levels and an output from which ECL-logic levels can be taken off, comprising a first current switch formed of first and second emitter coupled npn-transistors having their emitters commonly connected to ground reference potential via a current source and their collectors connected to supply potential via respective collector resistors, and a second current switch formed of first and second emitter-coupled pnp-transistors having their emitters connected to supply potential via a current source and having their collectors connected to ground reference potential, the first transistor of said second current switch being controlled by the input signal to the circuit arrangement and serves as input stage for the first transistor of said first current switch, said second transistors of the first and second current switch being connected at their control inputs to a reference potential and said second current switch having a switching threshold higher than that of said first current switch, and wherein a coupling capacitor is connected between the base and the emitter of said one transistor of said second current switch.

7. Circuit arrangement for level conversion of TTL-logic levels to ECL-logic levels including at least one emitter-coupled current switch having an input addressable by TTL-logic levels and an output from which ECL-logic levels can be taken off, comprising a first current switch formed of first and second emitter coupled npn-transistors having their emitters commonly connected to ground reference potential via a current source and their collectors connected to supply potential via respective collector resistors, and a second current switch formed of first and second emitter-coupled pnp-transistors having their emitters connected to supply potential via a current source and having their collectors connected to ground reference potential, the first transistor of said second current switch being controlled by the input signal to the circuit arrangement and serves as input stage for the first transistor of said first current switch, further comprising means for taking off ECL-logic levels from said collectors of said first current switch, inverted levels being taken off the collector of said first transistor, and non-inverted levels being taken off the collector of the second transistor of said first current switch, and wherein said two emitter-coupled transistors of said second current switch have emitters which are connected to the base of said first transistor of said first current switch, one of the transistors of said second current switch having a base addressable by the TTL-logic levels, the other of the transistors of said current switch having a base connected to the base of the other transistor of said first current switch and also connected to a reference voltage.

* * * * *